United States Patent
Kim et al.

(10) Patent No.: US 7,739,101 B2
(45) Date of Patent: Jun. 15, 2010

(54) EQUIVALENT CIRCUIT OF INDUCTOR

(75) Inventors: Sung Su Kim, Jeonju-si (KR); Yeo Cho Yoon, Yeongdeungpo-gu (KR)

(73) Assignee: Dongby Hitek Co., Ltd., Seoul (KR)

( * ) Notice: Subject to any disclaimer, the term of this patent is extended or adjusted under 35 U.S.C. 154(b) by 413 days.

(21) Appl. No.: 11/929,989

(22) Filed: Oct. 30, 2007

(65) Prior Publication Data

US 2008/0162105 A1    Jul. 3, 2008

(30) Foreign Application Priority Data

Dec. 27, 2006   (KR) .............. 10-2006-0134453

(51) Int. Cl.
| | |
|---|---|
| *G06F 9/455* | (2006.01) |
| *G06F 9/44* | (2006.01) |
| *G06F 9/00* | (2006.01) |
| *G06G 7/62* | (2006.01) |
| *G06G 7/48* | (2006.01) |
| *G06G 7/00* | (2006.01) |
| *H01F 27/28* | (2006.01) |
| *H01F 27/00* | (2006.01) |

(52) U.S. Cl. .................... 703/28; 336/223; 703/13; 703/14

(58) Field of Classification Search ............. 703/2, 703/3, 14, 28; 336/200, 223
See application file for complete search history.

(56) References Cited

OTHER PUBLICATIONS

Sia et al, "A Simple and Scalable Model for Spiral Inductors on Silicon", 2001, Modeling and Simulation of Microsystems 2001, pp. 358-361.*

Kuhn et al, "Modeling Spiral Inductors in SOS Processes", May 2004, IEEE Transactions on Electron Devices, vol. 51, No. 5, pp. 677-683.*

Yue et al, "Physical Modeling of Spiral Inductors on Silicon", Mar. 2000, IEEE Transactions on Electron Devices vol. 47, No. 3, pp. 560-568.*

* cited by examiner

*Primary Examiner*—Kamini S Shah
*Assistant Examiner*—Hung Havan
(74) *Attorney, Agent, or Firm*—Saliwanchik, Lloyd & Saliwanchik

(57) ABSTRACT

An equivalent circuit of an inductor is provided with a five wire structure. A first wire has a first resistor, an inductor, and a third resistor connected in series. A second wire is connected in parallel with the first wire and has a second resistor. A third wire is connected in parallel with the first and second wires and has a third capacitor. A fourth wire is serially connected to a first common node of the first, second, and third wires, and has a first capacitor connected between the first common node and a first sub capacitor and a first sub resistor connected in parallel. A fifth wire is serially connected to a second common node of the first, second, and third wires, and has a second capacitor connected between the second common node and a second sub capacitor and a second sub resistor connected in parallel.

4 Claims, 1 Drawing Sheet

EQUIVALENT CIRCUIT OF INDUCTOR

CROSS-REFERENCE TO RELATED APPLICATION

The present application claims the benefit under 35 U.S.C. §119 of Korean Patent Application No. 10-2006-0134453, filed Dec. 27, 2006, which is hereby incorporated by reference in its entirety.

BACKGROUND

A spiral inductor shows a skin effect where, as frequency is increased, current is concentrated on a surface of a conductor. A spiral inductor also shows a proximity effect where upon bringing another conductor in proximity with the spiral inductor, a high frequency current is more intensively flowed into a portion close to the other conductor. In order to represent these two effects in an equivalent circuit of the inductor, a coupling form of a 2-π equivalent circuit model that is a modification of an existing single-π model was recently disclosed in an article and is shown in FIG. 1.

However, the 2-π equivalent circuit model has problems in that the extraction of the model is complicated and a large error can be generated in the value of the extracted parameter.

BRIEF SUMMARY

Embodiments of the present invention provide an equivalent circuit model of an inductor including the skin effect as described above that modifies a single-π equivalent model to improve the result of modeling. Embodiments of the present invention also provide an equivalent circuit of an inductor that is simple and has a low possibility of error because the initial values of parameters of an equivalent circuit model for an optimization process are extracted through a series of extraction equations.

An equivalent circuit of an inductor according to an embodiment is provided with a five wire structure. A first wire has an inductor and first and third resistors connected to the inductor in series. A second wire is connected in parallel with the first wire and has a second resistor. A third wire is connected in parallel with the first and second wires and has a third capacitor. A fourth wire is serially connected to a first common node of the first, second, and third wires, and has a first sub capacitor and a first sub resistor connected in parallel and a first capacitor connected in series between a common node of the first sub capacitor and the first resistor and the first common node of the first, second, and third wires. A fifth wire is serially connected to a second common node of the first, second, and third wires, and has a second sub capacitor and a second sub resistor connected in parallel and a second capacitor connected in series between a common node of the second sub capacitor and the second sub resistor and the second common node of the first, second, and third wires.

DETAILED DESCRIPTION

Hereinafter, an embodiment of the present invention will be described with reference to the accompanying drawings.

Figure 1:
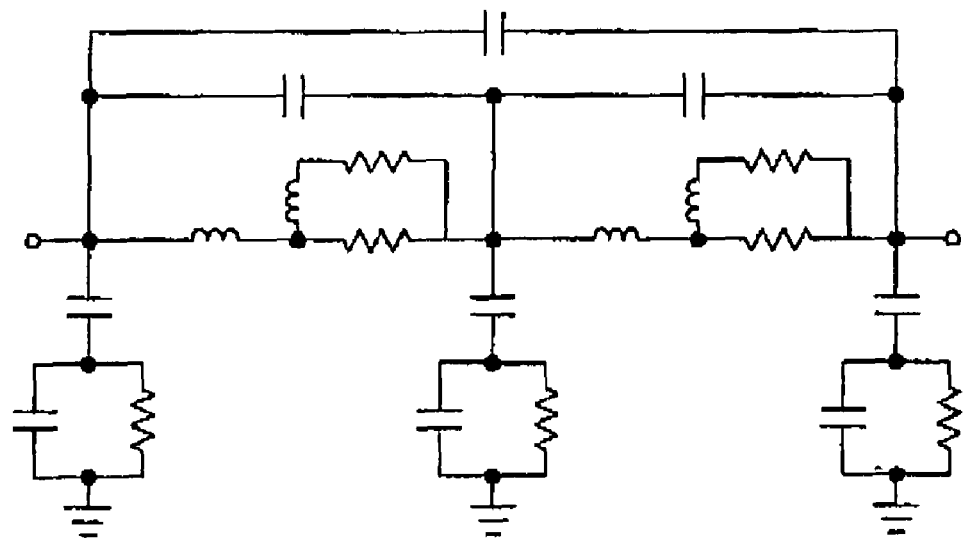
FIG. 1 shows an equivalent circuit of a 2-π inductor in a related art.
Figure 2:
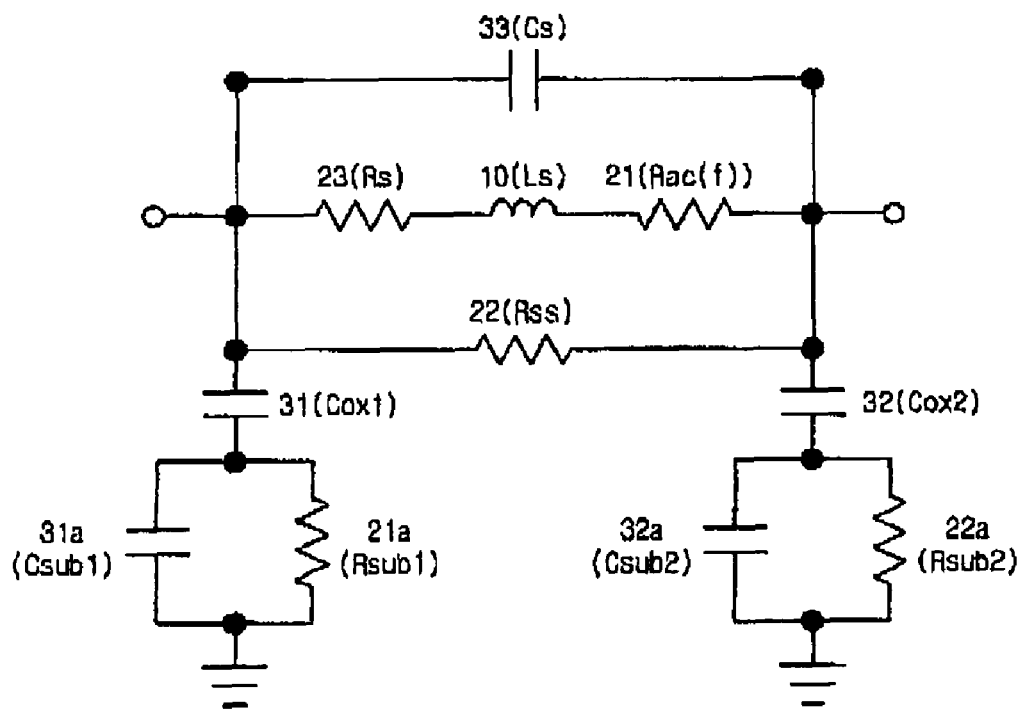
FIG. 2 shows an equivalent circuit of an inductor according to an embodiment of the present invention.

FIG. 2 shows an equivalent circuit of an inductor according to an embodiment of the present invention.

As shown in FIG. 2, the equivalent circuit of the inductor includes a first wire having a first resistor 21 ($R_{ac}(f)$) and a third resistor 23 ($R_s$) connected to an inductor 10 ($L_s$) in series.

Meanwhile, a second wire disposed with a second resistor 22 ($R_{ss}$) and a third wire disposed with a third capacitor 33 ($C_s$) are connected to the first wire in parallel.

A fourth wire has a first sub capacitor 31a ($C_{sub1}$) and a first sub resistor 21a ($R_{sub1}$) connected in parallel, and a first capacitor 31 ($C_{ox1}$) serially connected to a common node of the first sub capacitor 31a ($C_{sub1}$) and the first sub resistor 21a ($R_{sub1}$) and a first common node of the first, second, and third wires.

Also, a fifth wire is provided having a second sub capacitor 32a ($C_{sub2}$) and a second sub resistor 22a ($R_{sub2}$) connected in parallel, and a second capacitor 32 ($C_{ox2}$) serially connected to a common node of the second sub capacitor 32a ($C_{sub2}$) and the second sub resistor 22a ($R_{sub2}$) and a second common node of the first, second, and third wires.

As shown, one terminal of the fourth wire and one terminal of the fifth wire are connected to the first, second, and third wires in series and the other terminals thereof are grounded.

In FIG. 2, the first resistor 21 ($R_{ac}(f)$) has a resistance value that varies with frequency and that represents a physical effect that is generated in a high frequency region. The second resistor 22 ($R_{ss}$) represents an equivalent serial parasitic resistance generated in the overall equivalent circuit of the inductor.

The value of the first resistor 21 ($R_{ac}(f)$) can be yielded by means of the following equation:

$$R_{ac}(f) = 0 \mid freq \leq FF_1$$

$$R_{ac}(f) = RRAC \times \left(\frac{freq - FF_1}{1 \times 10^9}\right)^{ETAC} \mid freq > FF_1 =$$

Here, $FF_1$ represents a threshold frequency (GHz) below which the first resistance is zero and RRAC is a constant for $R_{ac}$. As the frequency (freq) becomes higher than the threshold frequency ($FF_1$), the value of the first resistor 21 increases when the frequency (freq) increases due to the skin effect. ETAC is a constant that represents the extent of the increase of resistance with respect to the increase in frequency. The value of ETAC is derived in proportion to half of a skin depth and has a value of about 0.55 to 0.65 depending on the inductor. In an embodiment, the frequency ($FF_1$) is a frequency representing a skin depth of about 3.3 μm and has a value of about 0.6 GHz.

Also, the process of extracting each parameter can be as follows:

$$R_{ss} \approx -\frac{1}{\text{real}(Y_{12})} \left| \frac{(R_1 + R_{ac})}{(R_1 + R_{ac})^2 + (\omega L_1)^2} \right| \approx 0$$

$$R_t = (R_s // R_{ss}) \approx 50 \times \frac{1 + S_{11}}{1 - S_{11}} - 50$$

Here, $R_{ss}$ is the value of the second resistor 22, real($Y_{12}$) is a real part of forward admittance that is measured in a direction from the input terminal to an output terminal of the equivalent circuit, $R_1$ is a resistance value of the forward admittance, $L_1$ is a reactance value of the forward admittance, $R_{ac}$ is the value of the first resistor 21, $R_t$ is an equivalent parallel resistance, $R_s$ is the value of the third resistor 23, and ω is a frequency.

The equivalent parallel resistance value $R_t$ of the initial $R_s$ and $R_{ss}$ is obtained from $R_t$ in a low frequency region. Since $R_s \ll R_{ss}$, $R_t = R_s$. Since $R_t$ is the same as the equivalent resistance of the inductor in a DC region, it has a value similar to the value obtained by means of a Kelvin DC measurement. The initial $R_{ss}$ value is obtained from $R_{ss}$ in a high frequency region. Also, in the case of $L_s$ and $C_s$, they are connected in parallel on the equivalent circuit and the $L_s$ and $C_s$ with respect to imaginary component of $Y_{12}$ are a series of variables, and in general, since $1/(\omega L_s)2 \gg \omega Cs$ in the inductor, the value of $L_s$ can be given as follows:

$$L_s \approx \frac{\frac{1}{\operatorname{imag}(Y_{12})}}{\omega} \bigg| (R_1 + R_{ac})^2 \ll (\omega L_1)^2 \ \& \ C_s \approx 0$$

Here, $L_s$ is the value of the inductor 10, $C_s$ is the value of the third capacitor 33, $R_{ac}$ is the value of the first resistor 21, imag($Y_{12}$) is an imaginary part of forward admittance that is measured in a direction from the input terminal to the output terminal of the equivalent circuit, $R_1$ is the resistance value of the forward admittance, $L_1$ is a reactance value of the forward admittance, and ω is a frequency.

The $L_s$ for optimization is extracted from a high frequency region showing a linear state and the $C_s$ value approximating to 0 is obtained through the imaginary component of $Y_{12}$ using the extracted $L_s$. $C_{ox1}$, $C_{sub1}$, and $R_{sub1}$ are divided into real components and imaginary components from the sum of $Y_{11}$ and $Y_{12}$, and $C_{ox2}$, $C_{sub2}$, and $R_{sub2}$ are divided into real components and imaginary components from the sum of $Y_{22}$ and $Y_{12}$ so that their initial values are extracted. Meanwhile, in the above description, $C_{ox1}$ is the first capacitor 31, the $C_{sub1}$ is the first sub capacitor 31a, the $R_{sub1}$ is the first sub resistor 21a, $C_{ox2}$ is the second capacitor 32, $C_{sub2}$ is the second sub capacitor 32a, and $R_{sub2}$ is the second sub resistor 22a.

The circuit of FIG. 2 is an equivalent circuit that represents the measurement result of an inductor by representing the resistance component according to frequency due to the skin effect in the high frequency region, and at the same time, represents the measurement result of the serial resistance component ($R_{ss}$) in the entire frequency region. The equivalent circuit has an advantage of including the physical property of a model by using a predetermined extraction equation in an extraction process.

Of course, the equivalent circuit model can be implemented by a spiral inductor on a silicon substrate, including a shape of a metal line of a quadrangle, an octagon, and a circle. In such embodiments, the metal line used in implementing the spiral inductor preferably uses copper and gold.

With the equivalent circuit of the inductor according to the embodiment configured as described above, it can provide an equivalent circuit model of an inductor including a skin effect as described above that modifies the single-π equivalent model to improve the result of modeling. In addition, an equivalent circuit of the inductor is provided that is simple and has a low possibility of error because the initial values of the parameters of the equivalent circuit model for the optimization process are extracted through a series of extraction equations.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is understood that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variants and modifications in the component parts and/or arrangements, alternative uses will also be apparent to those skilled in the art.

What is claimed is:

1. An equivalent circuit of an inductor comprising:
   a first wire having a first resistor, a first inductor, and a third resistor connected in series between a first node and a second node;
   a second wire having a second resistor connected in parallel with the first wire between the first node and the second node;
   a third wire having a third capacitor connected in parallel with the first wire and the second wire between the first node and the second node;
   a fourth wire having a first sub capacitor and a first sub resistor connected in parallel and a first capacitor serially connected between the first node and the first sub capacitor and the first sub resistor configured in parallel, wherein another terminal of the first sub capacitor and the first sub resistor configured in parallel is grounded; and
   a fifth wire having a second sub capacitor and a second sub resistor connected in parallel and a second capacitor serially connected between the second node and the second sub capacitor and the second sub resistor configured in parallel, wherein another terminal of the second sub capacitor and the second sub resistor configured in parallel is grounded,
   wherein a value of the first resistor varies depending on frequency, wherein the value of the first resistor ($R_{ac}(f)$) is yielded by means of the following equation:

$$R_{ac}(f) = 0 \mid freq \leq FF_1$$

$$R_{ac}(f) = RRAC \times \left(\frac{freq - FF_1}{1 \times 10^9}\right)^{ETAC} \bigg| freq > FF_1$$

where $FF_1$ represents a threshold frequency (GHz) for the value of the first resistor to increase due to a skin effect, RRAC is a constant for $R_{ac}$, and ETAC is a constant representing the extent of the increase of resistance depending on the frequency.

2. The equivalent circuit according to claim 1, wherein a value of the second resistor ($R_{ss}$) is yielded by means of the following equation:

$$R_{ss} \approx -\frac{1}{\text{real}(Y_{12})} \left| \frac{(R_1 + R_{ac})}{(R_1 + R_{ac})^2 + (\omega L_1)^2} \approx 0 \right.$$

where $\text{real}(Y_{12})$ is a real part of forward admittance that is measured in a direction from an input terminal to an output terminal of the equivalent circuit, $R_1$ is a resistance value of the forward admittance, $L_1$ is a reactance value of the forward admittance, $R_{ac}$ is a value of the first resistor, and $\omega$ is frequency.

3. The equivalent circuit according to claim 1, wherein the first inductor ($L_s$) is yielded by means of the following equation:

$$L_s \approx \frac{\frac{1}{\text{imag}(Y_{12})}}{\omega} \left| (R_1 + R_{ac})^2 \ll (\omega L_1)^2 \ \& C_s \approx 0 \right.$$

where $C_s$ is a value of the third capacitor, $R_{ac}$ is a value of the first resistor, $\text{imag}(Y_{12})$ is an imaginary part of forward admittance that is measured in a direction from an input terminal to an output terminal of the equivalent circuit, $R_1$ is a resistance value of the forward admittance, $L_1$ is a reactance value of the forward admittance, and $\omega$ is a frequency.

4. The equivalent circuit according to claim 1, wherein the first node is an input terminal and the second node is an output terminal.

* * * * *